US011193207B2

(12) United States Patent
Nal et al.

(10) Patent No.: US 11,193,207 B2
(45) Date of Patent: Dec. 7, 2021

(54) TREATMENT CHAMBER FOR A CHEMICAL VAPOUR DEPOSITION (CVD) REACTOR AND THERMALIZATION PROCESS CARRIED OUT IN THIS CHAMBER

(71) Applicant: KOBUS SAS, Montbonnot-Saint-Martin (FR)

(72) Inventors: Patrice Nal, Grenoble (FR); Christophe Borean, Le Touvet (FR)

( * ) Notice: Subject to any disclaimer, the term of this patent is extended or adjusted under 35 U.S.C. 154(b) by 91 days.

(21) Appl. No.: 16/473,860

(22) PCT Filed: Jan. 9, 2018

(86) PCT No.: PCT/EP2018/050442
§ 371 (c)(1),
(2) Date: Jun. 26, 2019

(87) PCT Pub. No.: WO2018/130516
PCT Pub. Date: Jul. 19, 2018

(65) Prior Publication Data
US 2019/0323123 A1 Oct. 24, 2019

(30) Foreign Application Priority Data
Jan. 16, 2017 (FR) ...................................... 1750316

(51) Int. Cl.
*C23C 16/455* (2006.01)
*C23C 16/44* (2006.01)
*C23C 16/52* (2006.01)

(52) U.S. Cl.
CPC ...... *C23C 16/4557* (2013.01); *C23C 16/4402* (2013.01); *C23C 16/4409* (2013.01); *C23C 16/45565* (2013.01); *C23C 16/52* (2013.01)

(58) Field of Classification Search
None
See application file for complete search history.

(56) References Cited

U.S. PATENT DOCUMENTS

2011/0143551 A1* 6/2011 Borean ............. C23C 16/45574
438/758

FOREIGN PATENT DOCUMENTS

WO  WO-2009136019 A2 * 11/2009 ......... C23C 16/4557
WO  WO-2015140261 A1 *  9/2015 ....... C23C 16/45523

* cited by examiner

*Primary Examiner* — Joel G Horning
(74) *Attorney, Agent, or Firm* — Burr & Forman LLP; Harvey S. Kauget

(57) ABSTRACT

Treatment chamber (C) for a chemical vapor deposition (CVD) reactor, comprising, within a body (B) defining an enclosure (E) under partial vacuum, a system (3) for injecting reactive species with a view to being deposited on a substrate (8) placed on a support element (5), and a thermal control system (2) for regulating the temperature of the injection system (3) or keeping it substantially constant, this thermal control system (2) having an interface zone (ZI) with the injection system (3). The treatment chamber (C) further comprises, in the interface zone (ZI), at least one thermal transfer zone (ZT) that is (i) insulated from the enclosure under partial vacuum (E) by an insulating barrier to the pressure and to the diffusion of contaminating species and (ii) filled with a thermal interface material (10). Application for carrying out CVD depositions, especially pulsed CVD depositions.

4 Claims, 2 Drawing Sheets

TREATMENT CHAMBER FOR A CHEMICAL VAPOUR DEPOSITION (CVD) REACTOR AND THERMALIZATION PROCESS CARRIED OUT IN THIS CHAMBER

FIELD OF THE INVENTION

This invention concerns a processing chamber for a chemical vapour deposition (CVD) reactor. It also covers a thermalization process implemented in this chamber.

The field is more particularly that of the thermal regulation of the gas distribution system in a CVD reactor and the optimization of heat transfers in such a reactor.

BACKGROUND OF THE INVENTION

CVD-type depositions are made in reactors under partial vacuum conditions. In some of these reactors, the reactive species (e.g. reactant and precursor) are injected into a processing chamber through a room usually called a showerhead which faces a substrate to be treated and which includes a plurality of channels to inject the reactive species homogeneously into the volume above the substrate.

For example, document WO 2009/0136019 describes such a reactor with an injection shower comprising two distinct sets of channels for injecting reactive species separately.

These types of reactors equipped with an injection shower can be used to implement CVD-type deposition techniques. They can also be used to implement pulsed CVD techniques, as described for example in document WO 2015/140261. In this case, a shower with two distinct channel groups is used and the reactive species are injected as phase shifted pulses. This allows, for example, deposits to be made with a high degree of conformity, i.e. a high thickness uniformity on all sides of the patterns, with high growth rates.

These showerheads are wear parts that must be dismantled and replaced periodically. However, in the context of pulsed CVD deposits, and CVD deposits in general, there is a problem with thermalization or temperature maintenance of the reactor showerhead. Indeed, this part must be maintained at a precise temperature according to the process used. For this purpose, it is usually brought into contact with another part of the reactor whose temperature is controlled. Thermal transfer is therefore achieved by thermal contact between metal and metal (or between materials in the presence of each other) in a vacuum, through a double function, both fixing and thermal transfer. In this case, thermal transfer is mainly by conduction at the fixing points, i.e. on very small surfaces, and more marginally by radiation, since there is no thermal conduction in the vacuum.

To preserve the integrity of the thermosensitive precursors circulating in the showerhead and the uniformity of the deposit on the substrate, it is important that the temperature of this showerhead be uniform and constant over its entire surface.

However, such a showerhead is subjected to sudden and repeated energy inputs depending on the process steps, particularly when the substrate, placed on a heater, approaches the showerhead and the pressure in the chamber increases, or when a plasma is generated in the chamber.

In these configurations, the contact between the showerhead materials and the temperature-controlled vacuum chamber is not appropriate to ensure sufficient thermal transfer to the temperature-controlled area. In other words, the thermal resistance of this interface is too high to ensure a sufficiently fast thermal transfer.

It is also known to improve thermal conductivity between assembly elements by using an interface material—such as thermal grease—with low thermal resistance. However, this solution is not directly applicable in a CVD chamber, because only materials that are inert to the process concerned can be used to avoid the risk of contamination, and the vacuum problem that limits thermal conductivity still remains.

The purpose of this invention is to overcome the disadvantages encountered in reactors and CVD processing chambers of the prior art in terms of optimizing thermal transfers between gas showerheads and the thermal regulation systems, while offering lid configurations that can be easily dismantled in order to provide easy access to the substrate and the showerhead for its replacement.

SUMMARY OF THE INVENTION

This objective is achieved with a processing chamber for a chemical vapour deposition (CVD) reactor, said chamber comprising, within a body defining a partial vacuum chamber, an injection system for injecting reactive species for deposition on a substrate placed on a support element, and a thermal regulation system for regulating or maintaining substantially constant the temperature of the injection system, this thermal regulation system having an interface area with the injection system.

According to the invention, the processing chamber also includes, in the interface area, at least one thermal transfer area (i) insulated from the partial vacuum enclosure by a barrier insulating from pressure and diffusion of contaminating species, and (ii) filled with a thermal interface material.

The presence of a material allows the existence of a conductive thermal transfer that does not exist in a vacuum. This thermal interface material preferably has a low thermal resistance coefficient.

In particular, the thermal interface material may have a thermal conductivity equal to or greater than that of air (e.g. under the temperature and pressure conditions of the reactor environment).

The insulating barrier prevents pressure losses and the diffusion of compounds of the thermal interface material into the processing chamber, which would then be contaminating species.

Thanks to this new technique provided by the invention, it becomes possible to achieve a very efficient thermal interface while maintaining good maintainability.

Thus, the present invention provides a significant improvement in the temperature stability of the gas showerhead during the process, thanks to a better thermal conductivity between the showerhead and the upper part of the chamber integrating the thermal regulation system.

Indeed, the presence of this thermal interface material allows a thermal transfer by conduction, which is not the case under vacuum in which only much more limited thermal transfers by radiation are possible.

The thermal interface thus created makes it possible to evacuate the absorbed heat from the support element or substrate holder by the gas injection system when the latter is approached and when the pressure rises in the chamber when the gases are injected.

In addition to ensuring good thermal contact, this invention is simple to implement, does not require additional fluid channels, and does not make maintenance operations more complex.

In a preferred embodiment of the chamber according to the invention, the thermal regulation system is an integral part of a reactor lid, which is provided with an inlet for reactive species.

The injection system is advantageously connected to the lid via the interface area and the thermal regulation system, so that this injection system is easily accessible due to the removability of the lid.

This integrated configuration of the processing chamber lid helps to facilitate the replacement of the gas injection system.

In a particular embodiment of a processing chamber according to the invention, the processing chamber includes a thermal transfer area delimited by at least two interlocking insulating barriers.

The thermal transfer area thus delimited may, for example, have an annular shape in the case of a processing chamber with a cylindrical geometry.

In yet another particular embodiment of a processing chamber according to the invention, the processing chamber includes several thermal transfer areas distributed in the interface area and each delimited by an insulating barrier.

This insulating barrier can be arranged to provide one or more sealing areas around the thermal transfer area to provide a different pressure between the partial vacuum enclosure and the thermal transfer area. The insulating barrier may, for example, include one or more rows of seals arranged to separate the atmospheric pressure thermal transfer area from the partial vacuum enclosure.

The thermal control system can be advantageously equipped with one or more holes provided to put the thermal interface material under atmospheric pressure.

In a processing chamber according to the invention further comprising radio frequency means provided for generating a plasma by applying a radio frequency (RF) potential between the injection system and the substrate, this chamber further comprises means for electrically isolating the thermal regulation system from the rest of the body of the chamber which is grounded.

The injection system is advantageously arranged in the form of an injection or distribution shower comprising a plurality of channels designed to inject reactive species homogeneously into the partial vacuum chamber.

This distribution shower can also include two sets of separate channels to inject the reactive species separately. This separate injection is particularly useful for continuous deposits.

Reactive species can be injected in the form of phase shifted pulses, in order to achieve a pulsed CVD deposition. In this case, the pulses generate strong and rapid variations in pressure and temperature conditions in the chamber, making it all the more necessary to optimize thermal transfers.

In a particular embodiment of a processing chamber according to the invention, this chamber may also include means for adjusting the height of the substrate support element in the enclosure.

According to another aspect of the invention, a method is proposed for thermalizing a system for injecting reactive species into a processing chamber for a chemical vapour deposition (CVD) reactor, said chamber also including, within a body defining a partial vacuum chamber, an injection system for injecting reactive species for deposition on a substrate placed on a support element, said process comprising a thermal regulation to regulate or maintain substantially constant the temperature of the injection system, said thermal regulation being carried out from a part of the body lid and having an interface area with the injection system.

According to the invention, the thermalization process includes at the interface area: a conduction thermal transfer, via a thermal transfer area containing a thermal interface material, between the injection system and the upper part of the lid, insulation from the pressure and diffusion of contaminating species in the thermal transfer area from the partial vacuum enclosure.

The thermalization process according to the invention can be implemented in a reactor equipped with an injection system in the form of a showerhead. This showerhead can advantageously include two distinct sets of channels to inject the reactive species separately. Reactive species can be injected in the form of phase-shifted pulses.

BRIEF DESCRIPTION OF THE DRAWINGS

Other characteristics and advantages will appear in the description that follows of the methods of making a processing chamber according to the invention, given as non-exhaustive examples, with reference to the annexed drawings, wherein.

DETAILED DESCRIPTION OF EMBODIMENTS OF THE INVENTION

For the sake of simplifying the description, the same references will be used for elements that are identical or which have the same function in the various embodiments.

Since these embodiments are in no way limiting, it is possible, in particular, to consider variants of the invention that have only a selection of characteristics described or illustrated below that are isolated from the other characteristics described or illustrated (even if the selection is isolated within a sentence including said other characteristics), if the selection of characteristics is sufficient to impart a technical advantage or to distinguish the invention from the prior art. The selection includes at least one preferably functional characteristic without structural details, and/or with only a fraction of the structural details if that fraction is sufficient to impart a technical advantage or to distinguish the invention from the prior art.

Figure 1:
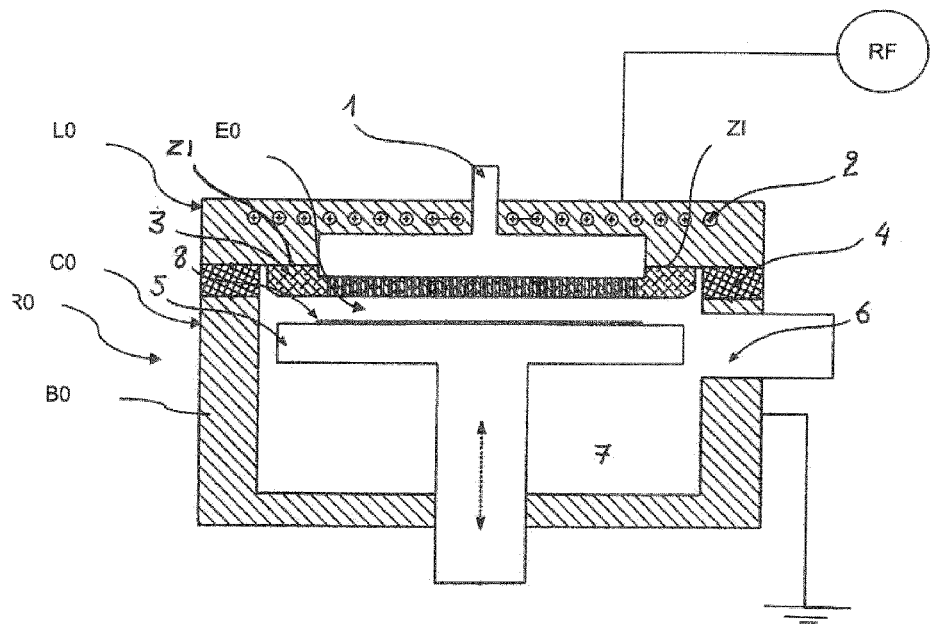
FIG. 1 shows a synoptic diagram of a processing chamber for a chemical vapour deposition reactor representative of the prior art.

FIG. 1 schematically illustrates a chemical vapour deposition CVD reactor RO representative of the state of the art. This reactor includes a processing chamber CO which is intended to perform pulsed CVD or CVD deposition on a substrate 8 placed on a support element or substrate holder 5 and is provided with a showerhead 3, for example of the type with two channel sets such as disclosed in document WO 2009/0136019. The showerhead 3 is a wear part that must be replaced periodically.

This prior art reactor RO can optionally implement a plasma generation by applying a radiofrequency (RF) potential between the showerhead 3 and the substrate 8 placed on the substrate holder 5.

The processing chamber CO has a body BO defining an enclosure EO that is maintained under partial vacuum, and is provided on its upper part with a removable lid LO and having an orifice 1 through which gases enter the enclosure EO.

The lid LO can be upgraded to RF potential when it is used in a CVD reactor using plasma generation. This lid LO is maintained at a constant temperature by means of a thermal regulation system 2 equipped, for example, with heating resistors, or operating by electromagnetic induction, or by using a circuit traversed by a heat transfer fluid such as a mixture of deionized water and ethylene glycol or such as the Galden® brand heat transfer fluid marketed by the Solvay Group.

The main function of the thermal control system 2 is to keep the showerhead 3 at a constant temperature.

An electrical insulator element 4 is provided to separate the part of the chamber CO that is RF potential positive from the rest of the chamber CO that is grounded.

The by-product gases from the reaction are discharged through a lateral orifice 6 in body BO of the processing chamber CO.

Substrate holder 5 keeps substrate 8 at a temperature and also performs an electrical function because, depending on the type of chamber, it can be subjected to a floating potential, ground, or polarized to a direct or alternating voltage. The substrate holder 5 can be maintained at temperatures from −40° C. to +800° C.

The height of the substrate holder 5 can be adjusted to optimize process performance and load/unload the substrate plate. The substrate holder 5 is located in a part 7 of the chamber CO and the walls of this part 7 are maintained at a zero electrical potential. It should be noted that the proximity of the substrate holder 5 and the rise in pressure of the chamber CO at the time of gas injection generate significant heat exchanges with the showerhead 3, which can modify the temperature of the latter.

With such a reactor, it is possible, for example, to make high-temperature deposits of polysilicon or amorphous silicon on the substrate 8. These processes require substrate temperatures between 600° C. and 700° C. and a pressure close to one third of atmospheric pressure, which contributes to a high thermal conductivity between the thermal control system 2 and the showerhead 3. If showerhead 3 is not maintained at a sufficiently low temperature, for example in the order of 80° C., degradation of the precursor may occur before the reaction area, leading to excessive particle generation that is very damaging to the process.

In another type of deposition, one may want to deposit a polymer, such as parylene, which requires sublimation of the precursor (at about 100° C.) and then pyrolysis at a temperature above 500° C. to activate the precursor in an area upstream of the chamber. The activated precursor is then transported to the chamber to settle on a substrate at room temperature. The temperature difference between the activated precursor and the substrate is one of the key points of the reaction. If the gas showerhead above the substrate is not maintained at a sufficiently high temperature, the deposition will take place on the showerhead instead of the substrate. As this deposit cannot be cleaned in situ, the average operating time of the chamber between two openings for cleaning is very low.

Figure 2:
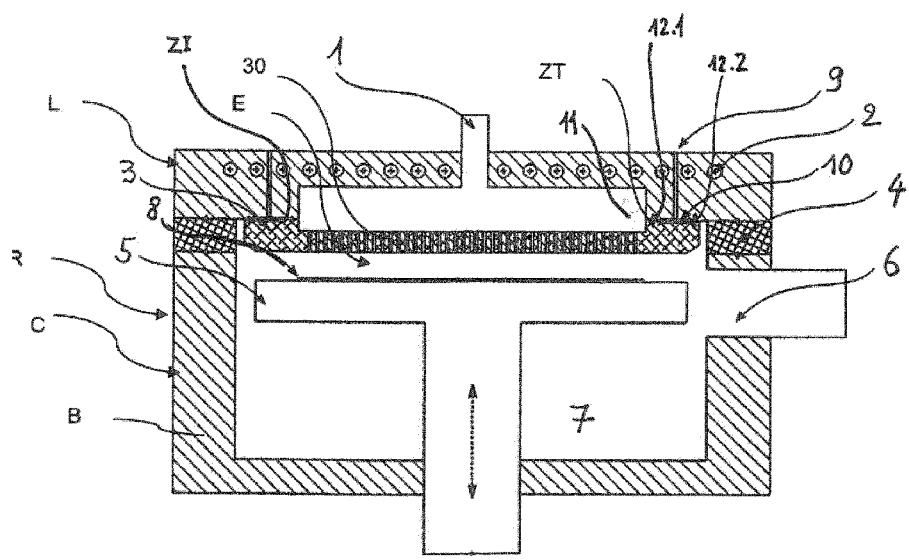
FIG. 2 shows a synoptic diagram of a first embodiment of a processing chamber for a chemical vapour deposition reactor according to the invention.

With reference to FIG. 2, a first embodiment of a processing chamber for a CVD reactor according to the invention will now be described. With the exception of the differences described below, this chamber C has characteristics in common with the chamber CO previously described in reference to FIG. 1 and can be implemented in a similar way.

In particular, chamber C differs from chamber CO in that it also includes, at the interface area ZI between the showerhead 3 and the thermal control system 2, a thermal transfer area ZT insulated from the partial vacuum enclosure E.

This thermal transfer area ZT is delimited and separated from enclosure E by a barrier which is insulating from the pressure and diffusion of chemical species. It is filled with a thermal interface material 10 which ensures thermal transfer by contact and conduction, and therefore has a very low thermal resistance coefficient compared to that which would be achieved with a vacuum interface as described for example in relation to FIG. 1.

The thermal transfer area ZT can include a counterbore that defines a free or constrained volume. It can be made in the form of several areas, each delimited by an insulating barrier, distributed in the interface zone ZI, or in the form of an area between two insulating barriers over the entire perimeter of the interface zone ZI.

The thermal interface material 10 can be trapped air, foam, conductive grease or malleable metal.

The thermal transfer area is not subject to vacuum and contains air and/or other material. This air remains trapped when the chamber is partially evacuated and ensures thermal transfer by conduction. The pressure in the transfer area therefore remains equal to or greater than the atmospheric pressure during assembly.

Figure 3:
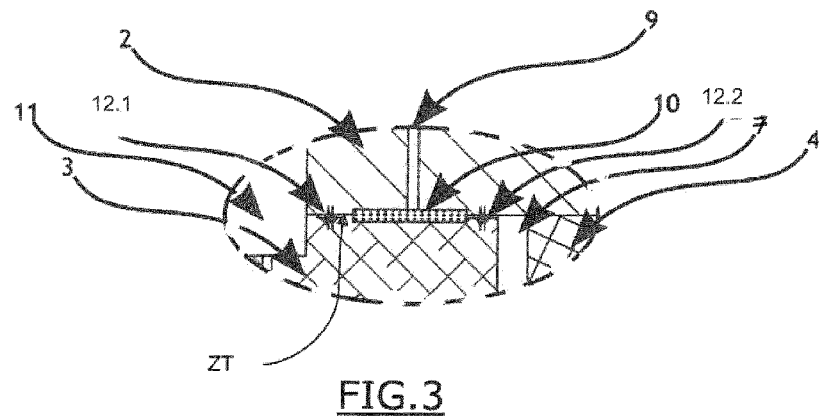
FIG. 3 is a partial enlarged view of the interface area of the processing chamber shown in FIG. 2.

The lid L of the processing chamber C has a set of holes 9 designed to bring the thermal transfer interface to atmospheric pressure, as shown in FIG. 3, which is a partial enlarged view of the thermal transfer area.

The thermal transfer area ZT has two sealing areas 12.1, 12.2 allowing to have a different pressure between a gas distribution area 11 before the showerhead 3 and the thermal contact area containing the thermal interface material 10 placed under atmospheric pressure via the hole 9 provided through the thermal regulation system 2. The two sealing areas 12.1, 12.2 form the insulating barrier enclosing the thermal transfer area ZT and can be designed as rows of seals to separate the part under atmospheric pressure from the part under low pressure or partial vacuum. The seals used can be O-rings in grooves, or metal seals able to withstand high temperatures.

Figure 4:
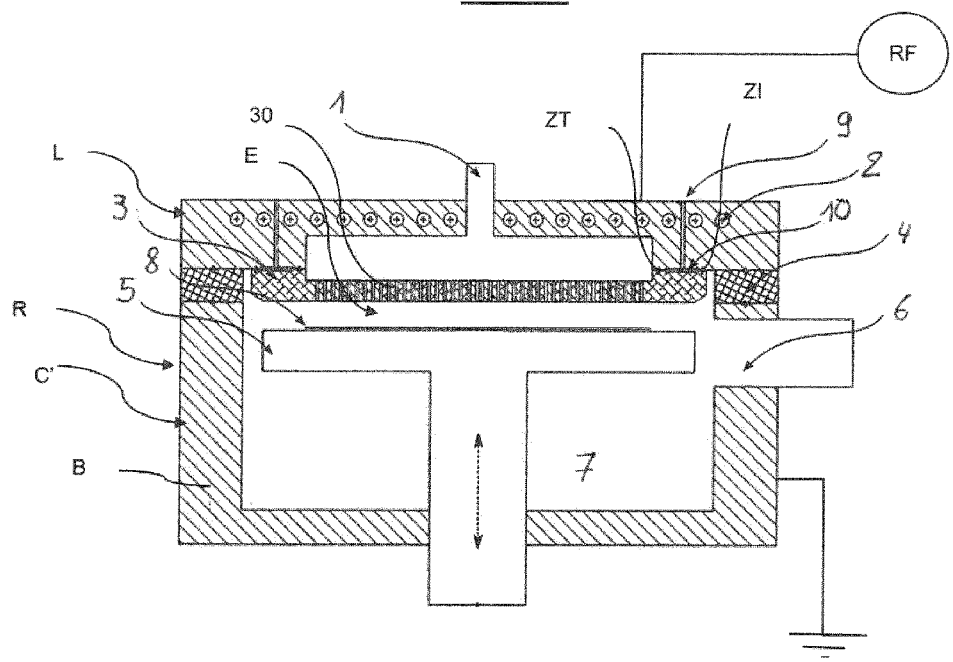
FIG. 4 shows a synoptic diagram of a second embodiment of a processing chamber for a chemical vapour deposition reactor according to the invention.

With reference to FIG. 4, a second embodiment of a processing chamber C' for a CVD reactor according to the invention will now be described. In addition to all the components common with chamber C illustrated in FIG. 2 and described above, chamber C' further includes a system for generating a plasma by applying a radiofrequency RF potential between the showerhead 3 and the substrate 8 placed on the substrate holder 5. This plasma generation system is for example an integral part of the showerhead 3. The lid L is connected to a radiofrequency source while the lower part of the body B of the processing chamber C' is grounded (zero potential). The showerhead 3 is electrically connected to the lid L via the interface area ZI and is electrically insulated from the lower part of the body B by means of the insulator element 4.

A processing chamber according to the invention may have a wide variety of configurations, each corresponding to a particular type of deposit or substrate or to a particular application. Thus, in the context of the present invention and as non-exhaustive examples, combinations of the following configurations of deposition, chamber and thermal regulation may be considered:

CVD Configurations showerhead with a plurality of channels showerhead with two distinct channel sets reactive species injected by homogeneous pulsed CVD:

showerhead with two distinct channel sets reactive species injected in the form of phase shifted pulses deposition types high temperature deposition of polysilicon or silicon on the substrate deposition of a polymer on the substrate Chamber gas pressure varying in the chamber according to the injection sequences of the reactive species RF plasma generated in the chamber Thermal regulation heating resistors electromagnetic induction heat-bearing fluid Naturally, the invention is not limited to the above-described examples and numerous changes can be made to these examples without going beyond the ambit of the invention. Of course, the various characteristics, shapes, alternative solutions and embodiments of the invention can be associated together in various combinations whenever they are not conflicting or mutually exclusive.

The invention claimed is:

1. A process for thermalizing a system for injecting reactive species into a processing chamber for a chemical vapour deposition reactor, comprising;
   providing the processing chamber,
   providing an injection system for injecting reactive species for deposition on a substrate placed on a support element within the processing chamber,
   providing an interface area with said injection system;
   regulating or maintaining substantially constant the temperature of said injection system, said thermal regulation being carried out from a part of said body forming a lid having a set of holes; and
   placing a thermal interface material under atmospheric pressure through the holes in the lid, the thermal surface material between said injection system and an upper part of the lid.

2. The Process according to claim 1, carried out in a reactor equipped with an injection system in the form of a showerhead.

3. The Process according to claim 2, carried out with a showerhead comprising two sets of distinct channels for injecting the reactive species separately.

4. The Process according to claim 3, wherein the reactive species are injected in the form of shift phase pulses.

\* \* \* \* \*

UNITED STATES PATENT AND TRADEMARK OFFICE
CERTIFICATE OF CORRECTION

PATENT NO.         : 11,193,207 B2
APPLICATION NO.    : 16/473860
DATED              : December 7, 2021
INVENTOR(S)        : Patrice Nal and Christophe Borean Page 1 of 1

It is certified that error appears in the above-identified patent and that said Letters Patent is hereby corrected as shown below:

In the Claims

Column 8, Line 15 in Claim 1, "surface" should be "interface"

Signed and Sealed this
Eighth Day of March, 2022

Drew Hirshfeld
*Performing the Functions and Duties of the*
*Under Secretary of Commerce for Intellectual Property and*
*Director of the United States Patent and Trademark Office*